United States Patent [19]

Mohwinkel et al.

[11] Patent Number: 5,821,827
[45] Date of Patent: Oct. 13, 1998

[54] COPLANAR OSCILLATOR CIRCUIT STRUCTURES

[75] Inventors: Clifford A. Mohwinkel, San Jose; Edward B. Stoneham, Los Altos, both of Calif.

[73] Assignee: Endgate Corporation, Sunnyvale, Calif.

[21] Appl. No.: 769,144

[22] Filed: Dec. 18, 1996

[51] Int. Cl.$^6$ .................. H01P 7/08; H03B 5/18
[52] U.S. Cl. .............. 331/99; 331/117 D; 331/77 V; 333/247
[58] Field of Search .............. 331/96, 99, 107 SL, 331/117 D, 117 V; 257/664, 778; 333/247, 250

[56] References Cited

U.S. PATENT DOCUMENTS

| | | | |
|---|---|---|---|
| 3,995,234 | 11/1976 | Tuccinardi | 331/117 FE |
| 4,045,750 | 8/1977 | Marshall | 333/100 |
| 4,135,168 | 1/1979 | Wade | 331/108 R |
| 4,189,688 | 2/1980 | Sechi et al. | 331/117 FE |
| 4,376,287 | 3/1983 | Sechi | 257/668 |
| 4,458,215 | 7/1984 | Huang et al. | 331/117 D |
| 4,528,524 | 7/1985 | Bert | 331/56 |
| 4,600,907 | 7/1986 | Greliman et al. | 333/246 |
| 4,670,722 | 6/1987 | Rauscher | 331/117 FE |
| 4,713,632 | 12/1987 | Nishikawa et al. | 331/117 D |
| 4,906,946 | 3/1990 | Mekata et al. | 331/99 |
| 5,087,896 | 2/1992 | Wen et al. | 331/117 D |
| 5,105,171 | 4/1992 | Wen et al. | 333/116 |
| 5,130,675 | 7/1992 | Sugawara | 331/117 D |
| 5,225,796 | 7/1993 | Williams et al. | 333/12 |
| 5,345,194 | 9/1994 | Nagasako | 331/99 |
| 5,349,317 | 9/1994 | Notani et al. | 333/236 |

FOREIGN PATENT DOCUMENTS 3136218  3/1983  Germany .............. 331/117 D

Primary Examiner—Siegfried H. Grimm
Attorney, Agent, or Firm—George M. Steres; Anderson & Adamson

[57] ABSTRACT

An oscillator circuit having a flip chip metalization pattern and base substrate metalization pattern is defined such that a common-drain oscillator is configured with the common drain interposed between the source and gate terminals, providing an effective RF common reference with reduced parasitic inductance elements which otherwise degrade oscillator power and phase noise at high frequencies. Multiple sets of such patterns on the substrate and such three-terminal devices on the flip chip are arranged such that conductor patterns on the substrate connecting separately from the gates and the sources of the multiple devices to the common-drain reference are easily configured into separable tuning (or resonator) and feedback circuits. A common-drain oscillator having an interdigitated capacitor coplanar cavity resonator circuit as the gate input circuit having reduced distributed inductance is realized utilizing the interposed common-drain connections provided thereby. Having many small devices, such as FETs, coupled closely together (each having very low parasitic and therefore very high potential operating frequency), the signal power of each adds arithmetically but the noise power adds statistically thereby achieving lower phase noise relative to the combined oscillator signal power. Circuit structures utilizing this invention can provide very large oscillator arrays providing a reduction in phase noise relative to the oscillation signal without having the usual device size limitations.

38 Claims, 6 Drawing Sheets

COPLANAR OSCILLATOR CIRCUIT STRUCTURES

BACKGROUND OF THE INVENTION

1. Field of the Invention

The invention relates to an integrated circuit flip chip circuit containing multiple active devices mounted on a base substrate having metalization patterns connected to the integrated circuit. More specifically, it relates to millimeter wave integrated oscillator circuits and particularly coplanar oscillator circuit structures constructed of multiple interconnected replicated cells including metalization patterns having reduced parasitic coupling to a common terminal.

2. Related Art

Background

In almost all oscillators employing three-terminal active devices, a signal path is required from an input to an output. The input to the three-terminal active device oscillator defines an input voltage or current phase and two output current-carrying terminals which generally have either in-phase or opposed-phase (inverting) currents at low frequency, effectively direct current (DC). In the case of a microwave FET the control input is the gate and the inverting output is the drain. In a large common-source FET, which is typically used to provide significant output power, the gate terminal is typically connected to circuitry which has a return path which extends a significant distance before returning to make connection with the drain (inverting) terminal. Any parasitic inductances or capacitances associated with the current paths connected to the gate and inverting terminal can limit the oscillator frequency response achievable.

Prior art oscillator circuits have used wire bonds to connect active devices to resonator and feedback circuits defined on substrates. At millimeter frequencies even the shortest wire bond can be 1/10 of a wavelength. A wire bond also acts like a loop having a relatively high parasitic inductance since it is spaced relatively far from the conductor or conductors carrying return current. Such a loop can introduce unacceptable radiation loss.

Leaded devices have leads typically on 25 to 100 mil centers. The leads of these devices also pass through glass-to-metal, ceramic or plastic seals which are lossy at microwave frequencies. It is an advantage to eliminate leaded devices and wire bonds to reduce losses and parasitic inductance. Flip chip or bump bonded chips have extremely low and uniform parasitic inductances.

Other prior art circuit structures have used substrates on which are defined the relevant stripline or microstrip conductor resonant and feedback circuits to be connected to active three terminal devices. Microstrip circuits usually have extra dielectric losses and stored magnetic energy (i.e. parasitic inductance) in the fields between the signal lines on one side of the substrate and the ground plane on the other side of the substrate. It is an advantage to eliminate microstrip circuits for high frequency oscillators. Coplanar circuits have generally lower dielectric loss because less of the field is coupled to the dielectric and lower radiation loss because fields are concentrated between more closely spaced adjacent conductors.

Common-drain circuit configurations are often used in high frequency circuits because of the improved gain-frequency characteristic provided. Parasitic inductances and capacitances in circuit paths associated with the common terminal of a FET oscillator contribute to large delays and inductances associated with the gate-drain circuit. This causes frequency limitations due to the delay and inductance. Losses in the current paths connected to the common terminal can also result in excess phase noise.

It is known that large FET devices configured from arrays of small FET devices give lower phase noise in oscillators than do the small FET devices by themselves due to the fact that injection-locked signals from elements of a FET array combine coherently while noise combines statistically. However, assembling larger devices from arrays of small FETs can result in relatively long signal paths to and from the device terminals. Longer paths have higher parasitic inductances and increased radiation losses which reduce the benefits of the larger structures.

Combined circuit structures are known in which individual devices of integrated circuit device arrays are each connected to one or more subsets of tuning or impedance-matching circuits to combine input and/or output signals for impedance-matching or power combining. An example of replicated circuit subsets connected in a circuit is described in U.S. patent application Ser. No. 08/555,131, now U.S. Pat. No. 5,623,231,issued to Mohwinkel et al. incorporated herein by reference.

Mohwinkel et al. shows a common-source microwave amplifier chip having a plurality of FETs and a plurality of associated terminals disposed at selected locations on a common face of the chip. An associated circuit is formed on a base substrate, which has a plurality of terminals corresponding to the device terminals on the chip. Input signal lines and output signal lines on the substrate are connected to associated terminals, with multiple input and output lines being combined.

Mohwinkel et al. shows common-source amplifiers with signal inputs from combined circuits connected to gate terminals of multiple FET pairs. Signal outputs from drain terminals of the FET pairs are combined on output signal lines. If metalization patterns were connected from drain to gate to make oscillators for such circuits, the patterns may have lengthy paths.

An example of a common-drain microwave circuit is shown in U.S. Pat. No. 4,135,168 issued to Wade. Wade shows a common-drain FET circuit having source and gate connections to associated circuits on nearby substrates. The drain connection is made to a large heat sink post that is not part of, nor is coplanar to, the metalization of the source and gate circuits. The extended return paths for currents from gate to drain and from source to drain results in significant series inductances and shunt capacitances.

In summary, large conventional common-source devices have problems associated with losses and parasitic inductances associated with the large physical layouts required to connect resonator and feedback circuits to the input and output terminals. In conventional common-drain circuits, the physical layout is also characterized by a long signal path for the return currents from gate to drain and from source to drain.

Prior art millimeter or microwave planar circuits have shown undesirable bond wire and/or microstrip radiation loss associated with the inductance and capacitance of long RF connections in gate-drain and source-drain circuits. It would be an advantage to have a low-parasitic common-drain circuit structure that could be used to construct oscillators having shorter connections and lower parasitics.

SUMMARY OF THE INVENTION

The coplanar common-drain oscillator circuit structure of the present invention provides markedly reduced parasitic inductances and capacitances associated with the return lines of gate-drain and source-drain circuits. Given a particular three-terminal device type, this invention enables construction of oscillators that operate at higher frequencies with wider voltage tuning ranges and lower phase noise than that of previously realized oscillators.

A first embodiment of the present invention is an elemental or single three-terminal flip chip active device bonded to a planar substrate. A resonant circuit (resonator) having first and second coplanar conductors is formed on the substrate. The first and second conductors are coupled to the gate (control) terminal and the drain (inverting) terminals respectively by flip chip bonds to respective first and second proximal ends within a connection region. A feedback circuit having a third and a fourth coplanar conductor is also formed on the substrate. The third and fourth conductors are connected to the source (non-inverting) terminal and the common drain terminal respectively by other flip chip bonds to respective third and fourth proximal ends within the connection region. The first conductor and third conductors are disposed on one side of the second conductor and fourth conductors joined to the common drain.

A second embodiment of the elemental oscillator has the first (gate) and third (source) coplanar conductors disposed on opposite sides of the coplanar second and fourth conductors joined to the common drain.

The first and second conductors of both embodiments form part of the resonator coupled to the gate/drain device terminals. The third and fourth conductors of both embodiments form part of the feedback circuit coupled to the source/drain device terminals. In both instances, there are minimal parasitic inductances and capacitances associated with the coupling of the resonant and feedback circuits to the respective gate/drain and source/drain terminal pair.

Larger oscillators may be assembled by replication and mirroring of copies of elemental oscillators and joining the copies together at adjacent sides. FETs with large active gate width are important for increasing output power and reducing phase noise. Impedance matching and power combining are provided by the combinations of elemental resonant and feedback circuits into coupled arrays of coplanar circuits on the substrate connected to corresponding arrays of three-terminal flip chip devices.

One embodiment of the invention is an array of flip chip bonded common-drain FETs having source and gate electrodes of adjacent pairs of devices. The source and gate electrodes of adjacent pairs are connected to respective spaced apart common source and gate terminals on opposite sides of the array. The electrodes of the drains of the connected pairs are disposed on opposite sides of the adjacent pairs. The pairs of source and gate connected devices may be disposed in a linear array with each pair having at least one drain electrode connected to a device terminal common to the drain electrode of the adjacent pair.

Combined circuit resonator and feedback (or gate/drain and source/drain) coplanar circuits are formed on an insulating substrate with a plurality of conductor terminals in each. Each combined resonator and feedback circuit may be constructed of a number of adjacent interconnected cells. The cells may be duplicates or replicates of one another or may also be modified from cell to adjacent cell. For this discussion, the term cell is taken to mean one of a number of interconnected subcircuit structures, including coplanar patterns formed on the substrate.

Each cell of each coplanar circuit may have a signal conductor terminal between adjacent signal or common-drain return terminals. Each cell of each circuit thus has a common-drain return terminal between it and each adjacent cell.

The device terminals and conductor terminals are arranged such that when the flip chip array device terminals are bonded to the substrate conductor terminals, the resonator terminals are connected to two corresponding gate/drain terminals. The feedback terminals of the corresponding feedback cell are connected to the corresponding source/drain terminals of the respective pair. The common-drain return terminals of the resonator and feedback cells are connected to the respective common-drains of the respective device pairs.

The cells of the resonator and feedback circuits of individual device pairs may thus be arrayed for impedance-matching or power combining or splitting purposes at either the resonator or feedback circuit. Dividing FETs into smaller composite pairs connected to such combined circuits allows higher frequency performance capability since the dimensions of the interconnected device pairs are smaller and hence have less device-level parasitic capacitance and inductance.

Common drain or common signal return lines between adjacent cells now act as part of the impedance-matching network for each device pair, and provide the advantage of minimizing stray parasitic inductance and capacitance.

Specific examples of the invention are shown in which the common-drain terminals between adjacent pairs are separate or are connected by common coplanar ground segments on the same substrate as the resonator and feedback circuits.

Examples are also shown of resonator and feedback circuits which may alternately omit connection to one (or more) common-drain terminals in order to form related resonator and feedback functions having different numbers of active pairs.

One embodiment of a common-drain oscillator of the present invention includes a gate resonator cell having an interdigitated capacitor. A particular embodiment of one gate resonator cell of this invention includes a coplanar frame which can be compared to a three-dimensional cavity resonator. The term planar cavity or coplanar cavity is used here as a two-dimensional analog of the three dimensional cavity well known in the high frequency oscillator art. A coplanar frame defines an opening (the coplanar analog to a three dimensional cavity) which encloses a coplanar capacitor formed of spaced apart elongate conductor segments arranged in two interdigitated capacitively coupled sets. The proximal ends of one set individually connect to separate input signal control terminals. Each input signal control terminal connects to the gate (i.e. controlling) electrodes of one adjacent FET pair in a composite array of FETs. The source (i.e. controlled ) electrodes of each pair of such gate-connected FETs are joined to at least one of the feedback terminals of a combined source-drain circuit.

The pairs of gate and source connected devices are arranged in an array such that the drain (i.e. controlled) electrodes of each device of the pair are oppositely offset from the pair and generally orthogonal to the gate and source terminals of the pair. The drain electrodes of adjacent pairs of devices are connected to a common device drain terminal therebetween. A coplanar common-drain connection segment joins all the common-drain terminals. The drain segment is part of the coplanar cavity frame thus forming part of the resonator for the oscillator.

The source terminals are disposed on one side of the common-drain segment and the gate terminals on the other.

The source terminals are connected to coplanar feedback signal conductors parallel to and spaced apart from coplanar source return conductors of the source circuit. The source return conductors are connected to the common-drain segment forming controlled impedance functions for the source circuit with minimal parasitic.

A central coplanar conductor forming an inductive element at the frequency range of interest, is connected between a junction of the distal ends of the second set of capacitor segments and one electrode of a tuning varactor. The other electrode of the varactor is connected to the cavity frame.

The capacitor, the inductive element, the varactor and the FET inputs thus form the resonator to a grounded drain oscillator circuit.

The capacitor segments, the FETs, and the frame are configured to provide a resonant coplanar cavity at a selected frequency, and further configured to provide equal signal current splitting between the central conductor and the gate electrodes. The parallel division of signal currents from the central conductor by the coupled capacitive segments provides improved oscillator output power and phase noise performance for the composite array.

BRIEF DESCRIPTION OF THE DRAWINGS

For a further understanding of the objects and advantages of the present invention, reference is made to the following detailed description, taken in conjunction with the accompanying drawings, in which like parts are given like reference numerals and wherein.

DETAILED DESCRIPTION OF AN EMBODIMENT OF THE INVENTION

The present invention provides a circuit structure in which one portion of a first conductor is connected to the control input of an active device and is positioned adjacent to another conductor connected to an inverting terminal of the active device. Another portion of the first conductor is positioned adjacent to yet another conductor connected to the non-inverting terminal of the active device. Such a structure is shown generally as 20 in FIG. 1. Circuit structure 20 includes an insulating substrate 22 having a planar surface 22a. A flip chip integrated circuit 24 (drawn as though transparent) defines a connection region 24a, inside the periphery of circuit 24 and indicated by dashed lines. The circuit 24 includes a three-terminal active device 26 configured to be flip chip bonded to the surface 22a.

Figure 1:
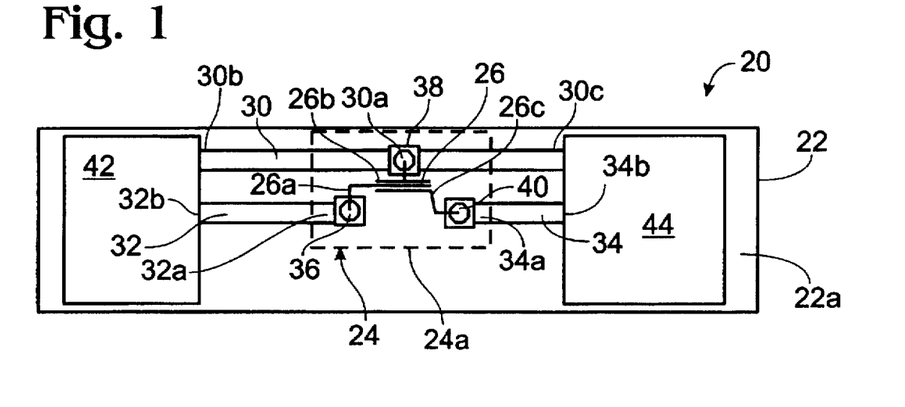
FIG. 1 is a simplified plan view of an elemental coplanar common-drain oscillator circuit in accordance with the present invention.

Three continuous coplanar conductors are formed on the surface 22a and connected between respective terminals. A second conductor 32, is spaced away from and disposed adjacent to one side of a first conductor 30. The first conductor 30 extends from a proximal flip chip connection 30a at a flip chip device terminal 38 to opposed distal ends 30b and 30c on opposite sides of the device 26. Conductor 32 extends from a proximal end 32a to a distal end 32b in the same direction as the distal end 30b of the first conductor 30.

Another conductor 34 is disposed adjacent to the conductor 30. Conductor 34 extends from a proximal end 34a spaced away from and adjacent to terminal 30a to a distal end 34b in the same direction as the distal end 30c of the conductor 30. Proximal end 34a is flip chip bonded to device terminal 40 within the connection region 24a. Conductors 32 and 34 are disposed on the same side of conductor 30.

The device 26 includes an input signal control electrode 26a, an inverting signal carrying electrode 26b, controlled by the electrode 26a and a non-inverting signal carrying electrode 26c controlled by the control signal at electrode 26a. The inverting electrode 26b carries a signal having an inverted relationship to the control signal of electrode 26a. The electrodes 26a, 26b and 26c are connected to the device terminals 36, 38 and 40 which are flip-chip bonded to the conductor terminals 32a, 30a, and 34a respectively.

The device 26 could be a GaAs FET, a bipolar junction transistor, a PBT, an HBT or the like. In the case where the device 26 is a FET, the input signal control terminal 36 is the gate, the inverting terminal 38 is the drain and the non-inverting terminal 40 is the source. In the following discussion, a GaAs FET is assumed.

The description of the present invention is cast in terms of a control electrode which controls the current in an inverting and non-inverting electrode. The description can equally be cast in terms of voltage control as an electrical circuit may be represented in either voltage or current source equivalent by means of Thèvenin's theorem ("Principles of Circuit Synthesis", Kuh and Pederson, page 51,1959, McGraw-Hill Book Company, New York).

The terminals 36, 38 and 40 are located within the connection region 24a. The outline or periphery of a flip chip device defines the area over which flip chip bonding of the device may be accomplished.

The size, shape and spacing of the coplanar conductors 30, 32 and 34 may be arranged to present controlled impedance characteristics to the device terminal pairs 36, 38 and 38, 40 respectively. The terminal 38 is a common terminal to the coplanar circuits formed by the adjacent pairs of conductors (30a, 30b), (32a, 32b) and (30a, 30c), (34a, 34b). There is thus minimal parasitic inductance and capacitance associated with the coplanar circuit paths from proximal ends 30a, 32a to distal ends 30b, 32b and from 30a, 34a to distal ends 30c, 34b.

Two coplanar conductor circuits 42, 44 are configured on the substrate 22 by conventional means such as plating, masking and etching or by deposition and patterning. The first circuit 42 is connected as an extension of the coplanar conductor ends 30b and 32b. The second circuit 44 is connected as an extension of the coplanar conductor ends 30c and 34b.

In a common drain FET oscillator embodiment of the present invention, the circuit 42 may be a resonator circuit, and the circuit 44 may be a feedback circuit having a common drain connection at the terminal 30a. This provides minimal parasitic inductance and capacitance between the device 26 and the two circuits 42, 44 by arranging the coplanar connecting conductors 30, 32 and 30, 34 as part of the coplanar circuits.

Bias connections are not shown, but may be accomplished with bond wires or air bridges or other conductive traces having RF blocking circuit elements between the respective terminals and suitable power supplies.

The coplanar conductors 30, 32 and 30, 34 may be electromagnetically coupled one to another to form part of the respective resonator and feedback circuits 42, 44. The coupled portions 30, 32 and 30, 34 may include simple coplanar rectilinear conductors of uniform width and spacing and combinations thereof. Additional components may be included, such as chip capacitors, resistors or inductors or the like which are mounted on the substrate 22 and connected by bond wires or air bridges or other coplanar flip chip terminal connections.

The drain terminal 38 forms a common RF connection between the resonator 42 and the feedback circuit 44 at the connection point 30a. The conductors 30, 32 and 30, 34 may be made arbitrarily short for a given source, drain and gate terminal layout, thereby minimizing parasitic inductances between the resonator circuit 42 and the gate-drain connections and between the feedback circuit 44 and the source-drain connections.

The parasitic elements of the active device are not shown, but are known to form part of the equivalent circuit of the oscillator. A flip chip active device inherently has very low inductive parasitic elements compared to beam lead or wire bonded devices. The parasitic elements of most importance are the capacitances between terminals, e.g., gate-drain, gate-source and drain-source, not shown here but well known to practitioners in the art.

The impedance characteristics of coplanar transmission lines or coplanar waveguide (CPW) can be held constant as the dimensions of the CPW are scaled up or down to connect between coplanar circuits and small active components. It is this characteristic, along with the separation of the three-terminals into the resonator pair and the feedback pair, having a common drain (inverting) terminal, which minimizes parasitic inductances and radiation losses in the connections to the three-terminal flip chip active device.

Figure 2:
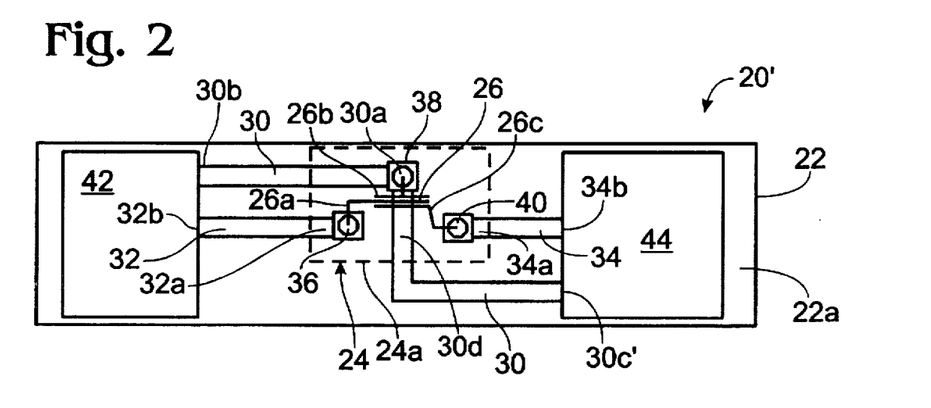
FIG. 2 is a plan view of an alternate embodiment of an elemental coplanar common-drain oscillator circuit.

With regard to FIG. 2, there is shown an alternative embodiment of the present invention indicated by the numeral 20' in which like elements have like reference numbers. The oscillator 20' includes all the elements of the oscillator of FIG. 1; in addition, a segment 30d of the conductor 30 passes between the terminals 36 and 40 to connect to the feedback circuit 44 at distal end 30c' on the opposite side of conductor 34. In this case also, there is minimal parasitic inductance in the conductors 30, 32 and 30, 34.

The resonator and feedback circuits 42, 44 may be selected from, or be a combination from the group of circuits including coplanar slotline circuits, slot strip circuits, coplanar waveguide circuits, coplanar strip circuits, coplanar transmission line circuits and other circuits employing coplanar conductors.

Figure 3:
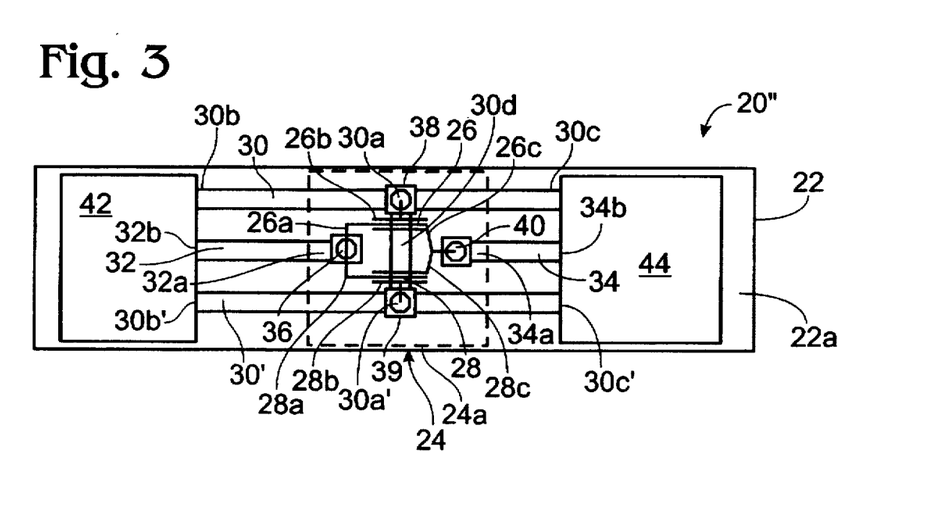
FIG. 3 illustrates a plan view of a pair of devices connected in a common-drain oscillator coplanar circuit array in accordance with the invention.
Figure 4:
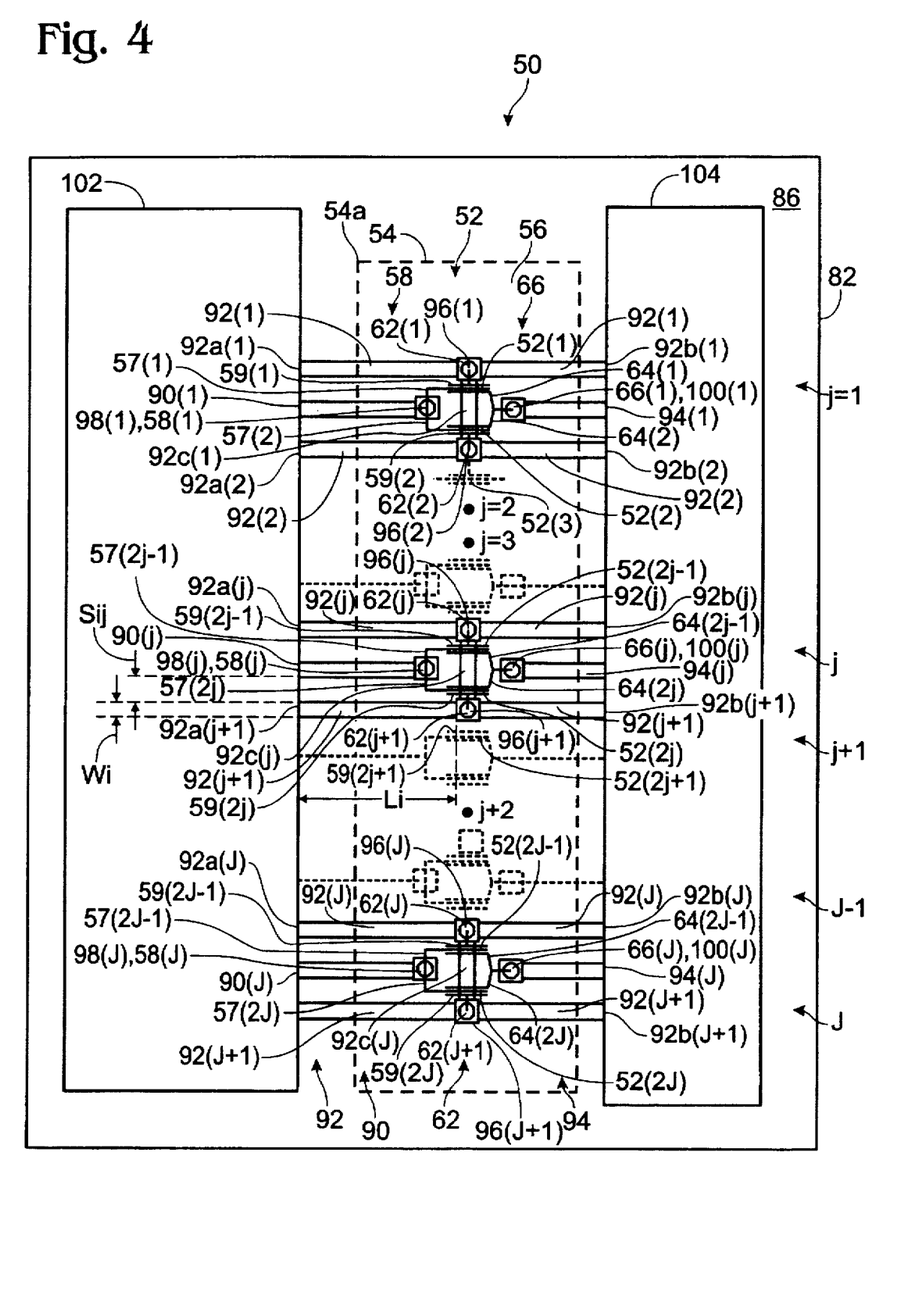
FIG. 4 illustrates an embodiment of a combined cell oscillator circuit array 50 in accordance with this invention.
Figure 5:
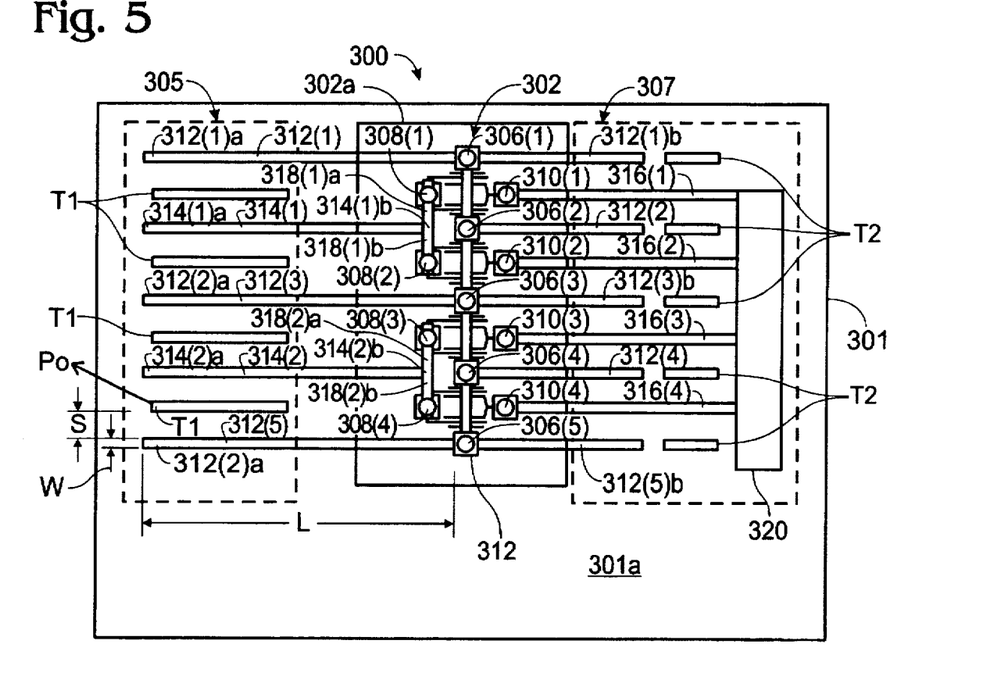
FIG. 5 depicts an alternative example of a coplanar common-drain oscillator array in accordance with the present invention.
Figure 6:
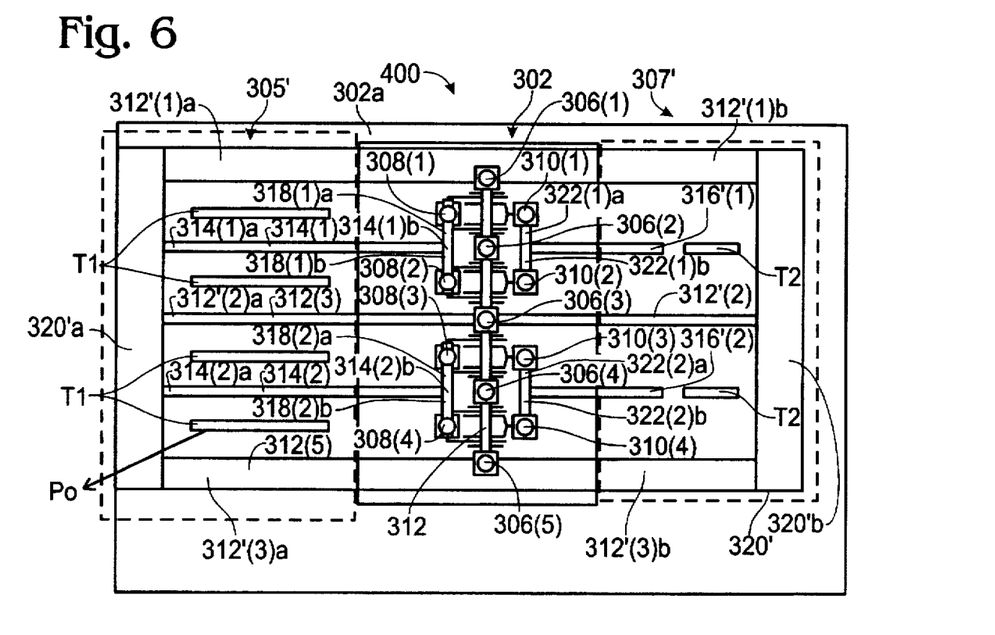
FIG. 6 portrays yet another embodiment of a coplanar common-drain oscillator array in accordance with this invention.

Larger arrays of circuits may be made by replicating and joining adjacent mirror images of the elemental circuits shown in FIGS. 1 and 2. FIG. 3 shows an example of combining a pair of devices as instances of replication and joining mirror image copies of patterns of FIG. 1 or 2, and is described here below. FIGS. 4–6 are instances of replication and joining mirror image copies of patterns of FIGS. 1 or 2 as described below.

Referring to FIG. 3, there is shown another embodiment 20" of the circuit structure shown in FIG. 1 in which like elements have the same reference numbers. An additional three-terminal device 28 is defined on the flip chip circuit 24. Device 28 has a gate electrode 28a, and source electrode 28c connected to the same control terminal 36 and non-inverting terminal 40 respectively. An inverting or drain electrode 28b of device 28 connects to a second common drain flip chip terminal 39.

A fourth common conductor 30' has opposed distal ends 30c' and 30b' joined at a common proximal point 30a'. The distal end 30c' connects to the feedback circuit 44, and the distal end 30b' connects to the resonator 42. The conductor 30' is connected to the flip chip terminal 39 at the common point 30a'. A conductor segment 30d may be located between the gate terminal 36 and the source terminal 40 to join the two common drain terminals 38, 39.

The topology of the coplanar circuit terminals, coplanar conductors and the device electrodes and terminals may be symmetrically arranged as shown in FIG. 3. Symmetry of the topology urges signal currents to be divided and summed equally in associated device terminals and conductors. It is generally necessary for equal division of gate signal currents from the gate conductor 32 into the gate electrodes 26a and 28a, and for equal summation of drain and source signal currents from the drain and source electrodes 26b, 28b and 26c, 28c into the drain and source conductors 30, 30' and 34 respectively.

The resonator 42 of FIG. 3 is configured with combined circuits including conductors 30, 32 and 30', 32. The feedback circuit 44 of FIG. 3 is also configured with combined circuits including conductors 30, 34 and 30', 34. The size, shape and spacing of the conductors 30, 32, 34, 30' and the electrodes of devices 26 and 28, in combination with the circuits 42, 44 may be arranged to direct currents to flow equally in respective gate, drain and source electrodes.

Larger arrays of devices may be constructed in accordance with the invention. With reference to FIG. 4, there is shown an embodiment of an array of elemental circuits to form a common-drain oscillator circuit 50 made in accordance with the invention. Oscillator 50 has a high Q gate-drain resonator 102 circuit connected to the gate-drain side of a FET array. Oscillator 50 includes a flip chip integrated circuit 54 having a planar face 56. The circuit 54 includes a longitudinal array 52 of J pairs of adjacent three-terminal active devices, enumerated 1, 2, ..., 2j–1, 2j ... 2J. J is an integer selected, for example, for the desired power output, size or phase noise relative to the signal of the oscillator 50, or other design consideration, and j is an index ranging from 1 to J.

For the purpose of this description, the active devices can be considered to be GaAs FETs. Other devices may also be used.

For descriptive purposes, another integer index, I, enumerates each device and ranges from 1 to 2J. Each pair, j, corresponds to individual devices 52 (I), 52 (I+1) where I=2j−1. Each device, I, includes a respective gate or current control electrode 57 (I), a spaced apart drain or inverted phase current-carrying electrode 59 (I), and a respective spaced apart source or in phase current-carrying electrode 64 (I). The respective device gate, drain and source electrodes are connected to corresponding gate terminals, 58(j) of gate terminal array 58, drain terminals 62(j) of drain terminal array 62, and source terminals 66(j) of source terminal array 66. The gate, source and drain terminals 58, 62 and 66 are defined on the face of the array 56 and are described further below.

In the descriptions hereinbelow, FET array terminals are defined to be coplanar such that they may be mounted to corresponding substrate conductor terminals disposed on an adjacent planar surface, e.g., the mounting plane of a substrate, by means of intermediate solder bumps, balls or the like.

The boundary of the circuit 54a defines a connection region enclosing the FET electrodes and FET terminals. The circuit 54a is generally rectangular with bilaterally opposed sides and adjoining ends.

The first pair of devices 52 (1) and 52 (2) have each gate electrode 57 (1) and 57 (2) connected to an electrically shared gate terminal 58 (1) disposed therebetween. The second pair of devices (not shown) have each gate electrode 57 (3) and 57(4) connected to a shared gate terminal 58 (2) disposed therebetween. Each successive pair of devices 52 (2j−1) and 52 (2j) has a respective gate electrode 57 (2j−1), 57 (2j) connected to a shared gate terminal 58 (j) disposed between the respective devices.

The gate terminals 58 (j) are aligned such that the gate terminal array 58 is disposed parallel to one side of the FET array 52. The gate electrodes 57(I) are commonly considered as input electrodes, although the oscillator's output power may be extracted from either the gate side or the source side. The one side of the device array 52 having the gate terminals array 58 is considered the resonator side.

The source electrodes 64 (2j−1) and 64 (2j) of the adjacent devices 52 (2j−1) and 52 (2j) may be similarly connected to shared source terminals 66 (j) aligned to form a source terminal array 66. The source terminal array 66 is aligned parallel to the array 52 and disposed on the opposite or feedback side of the array 52.

The drain electrodes 59 (2j−1) and 59 (2j) of each pair of gate and source connected devices 52 (2j−1) and 52 (2j) are disposed offset from and disposed between the respective gate and source electrodes, and located toward the opposed ends of the device array 52.

The first drain electrode 59 (1) is disposed at the one end of the array 52 and the last drain electrode 59 (2J) at the opposed end of array 52. The first drain electrode 59 (1) is connected to a first drain terminal 62 (1) disposed at the one end of the array 52. The last drain electrode 59 (2J) is connected to a last drain terminal 62 (J+1) disposed at the opposed end of the array 52.

Adjacent pairs of devices, j and j+1, are spaced apart such that the drain electrode 59 (2j) of the second device 52 (2j) of the first pair, j, and the drain electrode 59 (2j+1) of the first device 52 (2j+1) of the second pair, j+1, are adjacent and connected to a shared-drain terminal 62 (j+1) between the adjacent pair, j and j+1.

The drain terminals 62 (k), 1≤k≤J+1, are aligned to form a drain terminal array 62 parallel with the sides of the array 52. The array 62 of drain terminals is disposed within the connection region 54a between the gate terminal array 58 and the source terminal array 66.

An insulating substrate 82 having a planar face 86 includes three interdigitated longitudinal arrays 90, 92 and 94 of gate conductor segments 90 (j), drain conductor segments 92 (k), and source conductor segments 94(j), corresponding to the terminal arrays 58, 62 and 66 of the J pairs of devices above, where 1≤k≤J+1 and 1≤j≤J, as before.

Each drain conductor segment 92 (j) includes a drain conductor terminal 96 (j) located within the connection region 54a, generally centrally between opposed distal ends 92a and 92b. Each gate and source conductor segment 90 (j) and 94 (j) has respective proximal and distal ends. Each gate and source conductor segment 90 (j) and 94 (j) includes a respective gate conductor terminal 98 (j) and source conductor terminal 100 (j) connected to the respective proximal ends within the connection region 54a. The respective gate conductor terminal 98 (j) and source conductor terminal 100 (j) are disposed adjacent between the drain conductor terminal 96 (j) and drain conductor terminal 96 (j+1). A common-drain conductor segment 92c (j) may be connected between the shared drain terminals 96 (j) and 96 (j+1) of each pair, j, to form a continuous backbone, 92c. For all device pairs j=1 to J.

The respective drain conductor terminal 96 (j), gate conductor terminal 98 (j) and source conductor terminal 100 (j) are located such that, when the face 56 of flip chip circuit 54 is aligned to the face 86 of the substrate 82, conductive contact between respective conductor terminals and chip terminals (e.g., gate conductor terminal 98(j) to gate electrode terminal 58(j), drain conductor terminal 96(j) to drain electrode terminal 62(j), and source conductor terminal 100(j) to source electrode terminal 66(j) may be made by conductor interconnections such as conductive bumps or balls (not shown) placed therebetween.

Each respective gate conductor segment 90 (j) and source conductor 94 (j) segment extends distally and oppositely away from the respective gate conductor terminal 98 (j) and source conductor terminal 100 (j) to the respective distal ends.

The array of drain conductors 92 is aligned such that the distal end 92a (j) of conductor 92 (j) extends in one direction away from the central terminal 96 (j), spaced away from and adjacent to the gate conductor 90 (j) and the gate terminal 98 (j). The distal end 92b (j) of conductor 92 (j) extends in the opposite direction away from the central terminal 96 (j), spaced away from and adjacent to the source conductor 94 (j) and source terminals, 66 (j). The gate conductor array 90 and source conductor array 94 are arranged so that gate conductor 90 (j) and source conductor 94 (j) are spaced between drain conductors 92 (j) and 92 (j+1).

A first coplanar combined resonator circuit 102 is also formed on the substrate surface 82 and connected to the distal ends of the gate segments 90 (j) and drain segments distal ends 92a (j). A second coplanar combined feedback circuit 104 is similarly formed on the substrate surface 82 and connected to the distal ends of the source segments 94 (j) and the drain segment distal ends 92b (j).

Each gate segment 90 (j) in combination with drain segment 92 (j) forms a portion of the combined circuit 102. Each gate segment 90 (j) in combination with drain segment 92 (j+1) forms another portion of the combined circuit 102.

Each source segment 94 (j) in combination with drain segment 92 (j) forms a portion of the combined circuit 104. Each source segment 94 (j) in combination with drain segment 92 (j+1) forms another portion of the combined circuit 104.

Each conductor segment of the arrays 90, 92, 94 is dimensioned with width, Wi, and length, Li. Between each pair of adjacent segments, I, j, there is spacing Sij. The dimensions, Li and Wi, of the individual segments of the arrays 90, 92, 94 and their respective spacing, Sij, to adjacent segments may be selected to provide desired impedance transformation (matching), series self inductance, coupling inductance and capacitance and shunt capacitance to adjacent segments and to adjacent common-drain segments and to be incorporated as part of the respective gate-drain 102 or source-drain 104 circuits.

The gate terminal array 58 is disposed on one side of the drain terminal array 62 and the source terminal array 66 is disposed on the opposite side of the drain terminal array 62. Conductive access along the surface of the substrate to any common-drain terminal 62 (j) is thus freely available from either side of the drain terminal array 62. This is important for minimizing parasitic inductances and capacitances communicating with a common-drain terminal connected as part of a common-drain connection for tuning or impedance transformation circuits connected to either the gate-drain or source-drain terminals of transistors in the array 52.

The circuits 102 and 104 may be selected from, or be a combination selected from the group of circuits including coplanar slotline circuits, coplanar slotline strip circuits, coplanar waveguide circuits, coplanar strip transmission line circuits and other circuits employing coplanar conductors.

The circuits 102 and 104 and the dimensions and spacing of the conductor segments may be selected to provide nearly equal amplitude and phase current signals to each gate electrode 57 (I) such that the common-drain connections 62 (j) are effectively in phase.

In the oscillator embodiment 50 of the present invention, the gate resonator circuit 102 determines the frequency and may be arranged to provide input impedance transformation to the respective gate-drain segment pairs 90 (j), 92a (j), and 90 (j), 92a (j+1). The source circuit 104 is a drain-source feedback combined circuit that provides feedback and drain-source capacitance augmentation between respective source and drain segment pairs 94 (j), 92 (j) and 94 (j), 92 (j+1).

Output power may be extracted from the oscillator 50 by either or both inductive and capacitive coupling to one or more of the conductive segments 90 (j), 92 (j) or 94 (j), or by bonding a lead to one or more segments (not shown). Parallel combinations or push-pull combinations of multiple pairs of the devices 52 (I), may be enabled by adding cross coupled resistors between adjacent pairs, and by suitably combining the power output of adjacent pairs with Wilkenson combiners and the like.

FETs with symmetrical source and drain structures, i.e. those having channel dimensions and doping concentrations between the source and gate identical to those between gate and drain are typically made with central terminal pads designated as source pads located between the gate and drain pads. In order to use such FETs in embodiments of the present invention, the voltage bias to the FET must be changed to enable the central pads to be operated as common-drain instead of common-source.

Some FETs may have asymmetrical source and drain structures, i.e., having modified lateral geometry or doping profiles to increase drain-source voltage breakdown without increasing source resistance. The metal layout on such asymmetrical FETS may be arranged so that the drain electrodes may be centrally located with respect to the gate and source terminals to be bonded to the respective substrate conductor terminals.

The drain conductor segment 92c (j) may be omitted in cases where decreased coupling capacitance is desired between drain and gate or drain and source.

The drain backbone provided by the continuous connection of segments 92c (j) provides a shared conductor to both the gate circuit 102 and the source circuit 104 for suppressing unwanted oscillation modes. One or more intermediate drain conductor segments 92c (j) may also be deleted as required by the frequency determining circuitry 102 and 104.

Push-pull or series outputs may be obtained by suitably combining signals in the feedback source circuit 104 as is well known in the art. Larger arrays may be constructed by contiguous replication of such combinations to build oscillators having better phase noise.

The common-drain terminal connections, 96 (j) interposed between the gate and source terminal connections, 98 (j), 100 (j), and connected to the drain conductor segments 92 (j) extending distally along with the respective gate and source conductor segments 90 (j), 94 (j), provided by this invention thus enable multiple cells of common-drain transistors to be connected with tuning, combining and matching circuits at source-drain and gate-drain connections with minimal loss and delay contributed by the excess circuit path lengths along the common-drain conductor segments.

With reference to FIG. 5, there is shown an oscillator 300 which is a variant of the oscillator 50 of FIG. 4. The oscillator 300 includes an integrated circuit chip 302 disposed as a linear array of adjacent pairs of FETs. The array 302 has opposed ends defining a gate-drain side and an opposed source-drain side between the opposed ends and defines a connection region 302a.

A substrate 301 having a planar face 301a has a coplanar gate drain tuning circuit 305 and a source-drain feedback circuit 307 formed thereon. The gate-drain tuning circuit 305 is comprised of coplanar drain conductors 312(1), 312(3), 312(5) connecting to shared drain terminals 306(1), 306(3) and 306(5) within the connection region 302a. Opposite distal ends 312(1)a, (2)a, (3)a and 312(1)b, (2)b, (3)b extend in different directions away from the contacts 306(1), (3), (5).

The drain conductors 312(1), 312(3), 312(5) are separated by gate conductors 314(1) and 314(2) respectively. The gate conductors 314(1), 314(2) have proximal and distal ends, the proximal ends each joined to one of the shared ends of oppositely directed branches 318(1)a, 318(1)b and 318(2)a, 318(2)b. The other ends of branches 318(1)a, 318(1)b, 318(2)a and 318 (2)b are connected to shared gate terminals 308(1), 308(2) and 308(3), 308(4) respectively. Coplanar tuning elements T1 are disposed between conductors 312(1), 314(1) and 312(3), 314(1) and 312(3), 314(2) and 314(2), 312(5). The coplanar drain conductors 312(1), 312(3), 312 (5) and the gate conductors 314(1) and 314(2) form part of the multi-conductor coplanar waveguide gate-drain circuit 305.

The drain conductors 312(1), 312(3), 312(5) extend toward the source-drain circuit 307 to distal ends 312(1)b, 312(3)b, 312(5)b. Two additional drain conductors 312(2) and 312(4) are connected at proximal ends to additional shared drain terminals 306(2) and 306(4) within the connection region 302a. Conductors 312(2) and 312(4) extend distally toward and form part of the source circuit 307.

Coplanar source conductors 316(1, 2, 3, 4) having proximal and distal ends are respectively spaced between the pairs of coplanar drain conductors 312(1), 312(2); 312(2), 312(3); 312(3), 312(4); and 312(4), 312(5). Spaced apart tuning elements T2 are disposed between the coplanar source conductors 316(1, 2, 3, 4). The proximal ends of source conductors 316(1, 2, 3, 4) are connected to shared source terminals 310(1, 2, 3, 4) respectively within the connection region 302a. Distal ends of source conductors 316 are connected to a shared field metal 320. The coplanar drain conductors 312(1,2,3,4,5) and source conductors 316 (1, 2, 3, 4), field metal 320 and tuning elements T2 form part of the multi-coplanar waveguide feedback circuit 307.

The planar chip array 302 has four pairs of FETs, each pair with shared gates and shared sources flip chip bonded to respective shared gate-source terminal pairs 308(1), 310 (1); 308(2), 310(2); 308(3), 310(3); 308(4), 310(4). Each pair of FETs has the respective drains flip chip bonded to adjacent drain terminal pairs 306(1), 306(2); 306(2), 306(3); 306(3), 306(4); 306(4), 306(5).

A coplanar common-drain backbone 312 connects between the coplanar drain conductors 312(1), 312(2), 312 (3), 312(4), 312(5). This forms an effective RF common for the oscillator circuit 300.

Output power, Po, can be coupled out by a printed trace, a lead wire or an air bridge, a segment of transmission line or the like, coupled to the gate circuit 305 or source circuit 307.

The dimensions, W, L, and spacing, S, of the segments 312, 314, 316, 318 and tuning elements T1, T2 may be selected to achieve the desired feedback and the desired tuning frequency.

Alternative tuning circuits may be used in place of the multi-coplanar waveguide 305 of FIG. 5 for other embodiments of the present invention, such as a single open-circuit half wave or quarter wave transmission line or a shorted quarter-wave resonator (Colpitts-like).

An alternative example of a coplanar common-drain oscillator 400 in accordance with the present invention is shown with regard to FIG. 6 where like elements have like reference numbers as in FIG. 5.

The proximal ends of gate conductors 314 are shorted to a conducting frame 320' having an interior which surrounds gate resonator circuit 305', the FET array 302 and source circuit 307'.

Longitudinal outer drain conductor segments 312'(1)a, b and 312'(3)a, b replace the previous outer drain segments 312(1) and 312(5) of FIG. 5. Opposite distal ends of segments 312'(1)a and 312'(3)a connect between opposed ends of vertical end segment 320'a and the drain terminals 306(1) and 306(5) respectively. Opposite distal ends of segments 312'(1)b and 312'(2)b connect between opposed ends of vertical end segments 320'b and the drain terminals 306(1) and 306(5) respectively. This forms the continuous conducting frame 320'.

The gate conductors 314(1), 314(2) have the distal ends shorted to the end segment 320'a. The central drain conductor segment 312(3) also has the distal end shorted to the end segment 320'a, forming a shorted quarter-wave multi-coplanar waveguide resonator with the adjacent gate segments 314(1), 314(2) and the outer drain segments 312'(1)a and 312'(3)a.

The source circuit 307' is surrounded by the interior of the outer drain conductor segments 312'(1)b and 312'(3)b having respective distal ends connecting to the opposed ends of frame segment 320'b. The source terminals 310(1) and 310(2) are connected to proximal ends of source branches 322(1)a, 322(1)b and the source terminals 310(3) and 310(4) are connected to proximal ends of source branches 322(2)b, 322(2)b respectively.

Distal ends of branches 322(1)a, 322(1)b are joined together at a proximal end of source conductor 316'(1). Distal ends of branches 322(2)a, 322(2)b are joined together at a proximal end of source conductor 316'(2). The source conductor 316'(1) is centrally and uniformly spaced between the outer ground drain segment 312'(1)b and the central drain segment 312'(2). The source conductor 316'(2) is centrally and uniformly spaced between the drain segment 312'(3)b and the central drain segment 312'(2).

Source tuning elements T2 are collinear with and spaced between the respective distal ends of source segments 316' (1) and 316'(2) and the interior of frame segment 320'b. This forms the multi-coplanar waveguide augmented source-drain capacitance feedback circuit 307'.

The source circuit 307' may also be implemented as shorted coplanar strip transmission lines or shorted or open parallel slotlines with lengths adjusted to provide a desired capacitance between source and drain at the desired oscillation frequency.

It can be seen through the above examples that various configurations of common-drain oscillator circuits may be developed by modifying the gate and source circuits. It is also clear that additional subsections may be added to the FET array with corresponding circuit subsections to increase the power output and/or improve the phase noise.

Coupling elements such as T1 and T2 can be used for tuning and removing power from the oscillator. The common-drain oscillators of this invention can operate in push pull with similar coupling as shown, or may be operated in-phase with injection locking of the two halves by in-phase coupling as is well known.

Alternative coplanar common-drain structures which can accommodate FET arrays having electrode source terminals located between the gate electrode and drain electrode terminals are also included in the present invention. Two examples are shown with reference to FIGS. 7 and 8.

Figure 7:
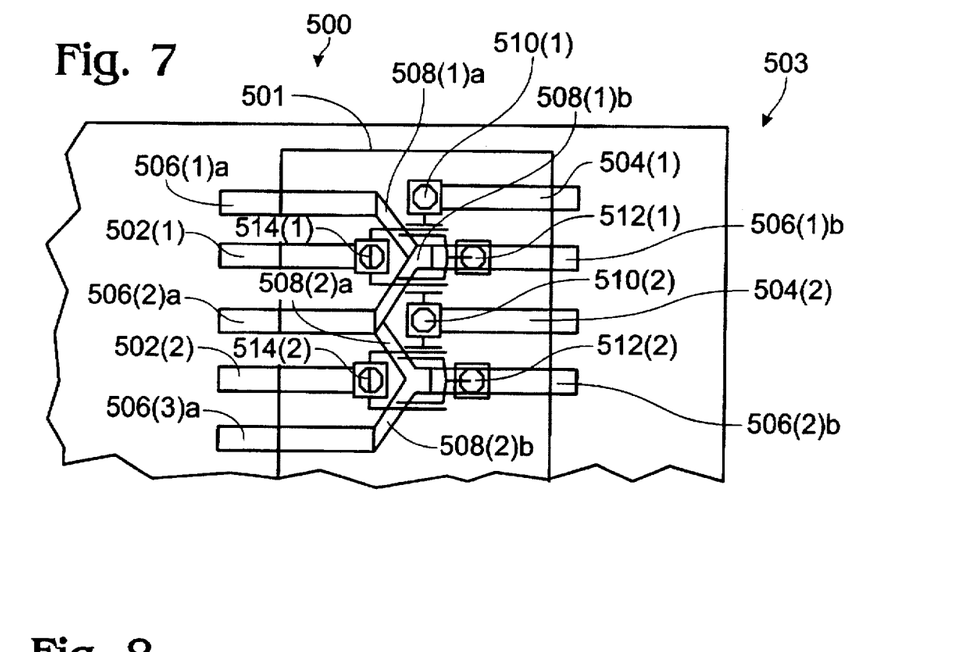
FIG. 7 shows an embodiment of a common-drain oscillator circuit array in accordance with the present invention, having an RF open circuit terminated gate-drain resonator.

FIG. 7 illustrates a portion of a coplanar common-drain oscillator 500 having a FET array 501 bonded to a conductive patterned substrate 503 as previously described. The array 501 defines a connection region 501a thereon. The oscillator 500 includes a coplanar waveguide gate resonator circuit having open-circuit terminations described below.

The FET array 501 has source, drain, and gate electrode arrays 510, 512, 514 connected to corresponding array terminals 510', 512', 514' (not shown). The array terminals are connected by solder bumps or balls to respective source, drain and gate conductor terminals 510, 512, 514 mounted on the substrate 503.

The source conductor terminals 510(1, 2, 3) are connected to proximal ends of parallel coplanar source conductor segments 504(1, 2, 3) respectively. The segments 504(1, 2, 3) extend distally in one direction outward from the array 501 to terminate at equal length open-circuit distal ends.

The drain conductor terminals 512(1, 2) are disposed along one side of the array 501 and connected to proximal ends of parallel coplanar drain conductor segments 506(1, 2)b respectively. The drain conductor segments 506(1, 2)b are disposed symmetrically between the source segments 504(1,2) and 504(2, 3) respectively. The drain conductor segments 506(1, 2)b extend distally in the one direction from the array.

The source conductor segments 504 and the drain conductor segments 506b form the source-drain multi-coplanar waveguide feedback circuit for the oscillator 500. Augmentation of the drain-source capacitance may be provided by additional length of the conductors 504 and 506 or by microwave integrated circuit (MMIC) chip capacitors or the like.

The drain conductor terminals 512(1, 2) are joined to a proximal base end of y-shaped coplanar conductor branches 508a,b respectively within the connection region 501a. Branches 508a, b have branching arms 508(1, 2)a and 508(1, 2)b having distal ends, which diverge distally from the base end 508a,b toward the other side of the array 501.

Branches 508(1)a and 508(2)a are disposed between the gate terminal 514(1) and respective source terminals 510(1) and 510(2). Branches 508(2)a and 508(2)b are disposed between the gate terminal 514(2) and the respective source terminals 510(2) and 510(3). The distal end of the branch 508(1)a joins a proximal end of a drain conductor segment 506(1)a within the connection region 501a. The distal end of the branch 508(2)a joins a proximal end of a drain conductor segment 506(2)a. The distal end of the branch 508(1)b also joins the proximal end of segment 506(2)a. The distal end of the branch 508(2)b joins a proximal end of a drain conductor segment 506(3)a.

The gate terminals 514(1, 2) are connected to proximal ends of parallel gate conductor segments 502(1, 2) respectively. Segments 502(1,2) extend distally away from the other side of the array.

The conductor segments 506(1,2)a are disposed around the gate conductor segment 502(1). The conductor segments 506(2, 3)a are disposed around the gate conductor segment 502(2). Segments 506(1, 2, 3)a extend distally from their proximal ends away from the array 501.

Segments 506(1, 2, 3)a and 502(1,2) form part of an open-circuit terminated multi-coplanar waveguide gate tuning circuit for the common-drain oscillator 500.

The contiguous conductor structure 512, 508, 506 defines a common-drain connection for the FETs of the array 501, separating the gate and source terminals from one another. Inverted phase RF signals provided by the drain electrodes of the array 501 FETs are thus combined with minimum path length and minimum parasitic inductances and capacitances for return to respective gate or source circuits.

Circulating gate-drain currents for each gate-drain conductor pair such as 506(1)a, 506(2)a and 502(1) have only the short drain conductor segments 508(1)a,b coupling to circulating source-drain currents for each source-drain conductor pair, such as 504(1), 512(1) and 504(2).

Figure 8:
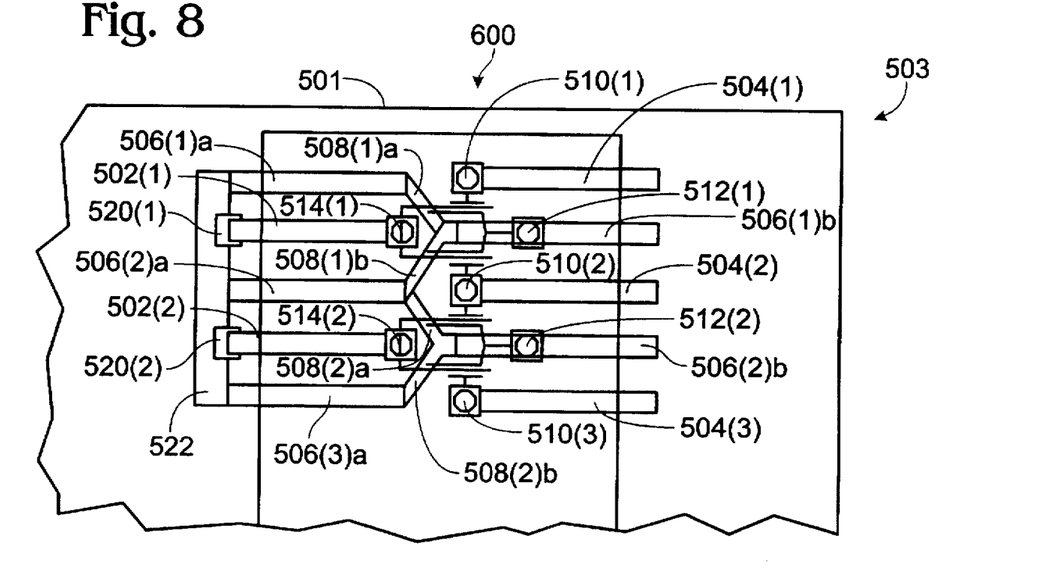
FIG. 8 shows an embodiment of a common-drain oscillator circuit array in accordance with the present invention, having an RF short circuit terminated gate-drain resonator.

Regarding FIG. 8, there is shown an embodiment of a common-drain oscillator circuit 600 in accordance with the present invention, having an RF short-circuit terminated gate tuning circuit with like elements having like reference numbers as shown in FIG. 7.

An end conductor segment 522 joins the distal ends of the drain conductor segments 506(1, 2, 3)a. The end conductor segment 522 is connected to the distal ends of gate conductor segments 502(1,2) by RF coupling capacitors 520(1,2) respectively. The capacitors 520 may be chip capacitors, thin film capacitors or the like which may provide tuning elements or essentially zero RF impedance between the distal ends of segments 502(1,2) and the conductor segment 522.

The drain-source circuit may also be a resonator circuit in which the capacitive feedback between source and drain is provided when the drain-source resonator is off resonance; above resonance for parallel type resonance, and below resonance for series type resonance.

Varactor tuning of the common-drain oscillator 600 can be achieved by electromagnetic coupling of a varactor in either the gate-source tuning circuit or in the source-drain tuning circuit.

A broader tuning range can be achieved by tuning in both the gate-drain circuit and the source-drain circuit. In the common-drain configuration of the present invention, low inductance connections from the gate or source conductors and the common-drain conductors to single or multiple varactors are easily made.

Figure 9:
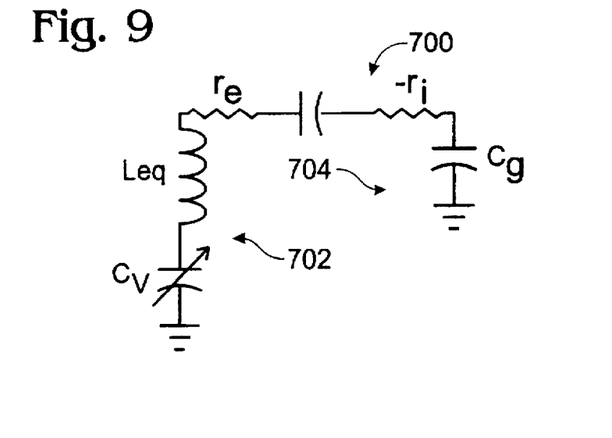
FIG. 9 is an equivalent circuit schematic of the gate-drain resonator circuit of FIG. 10.

Another embodiment of the present invention is illustrated with reference to FIGS. 9 and 10 of a common-drain oscillator having an interdigitated capacitor resonator gate circuit. FIG. 9 is an equivalent circuit schematic 700 of the oscillator of FIG. 10 Equivalent circuit 702 represents a gate-drain (input) resonator of FIG. 10. Equivalent circuit 704 represents the gate-drain circuit of the FETs of FIG. 10 with a source-drain feedback circuit connected and is described further here below.

C1 is the capacitance of the interdigitated coplanar cavity resonator capacitor described below and Cg the equivalent capacitance of the equivalent input (gate-drain) combination 704 of the FETs with the source-drain circuit connected (the combination shown as 803, 825(1–5), 826(1–4), 830(1–4) and 845(1–4) in FIG. 10).

The conditions for oscillation of the circuit 700 are that the equivalent loss resistance, here represented by $r_e$ of gate resonator input circuit 702 comprised of $C_v$, $L_{eq}$, $r_e$ and $C_1$, must be smaller in magnitude than the equivalent small signal series negative resistance of input 704 of the active devices (in this case, FETs). $C_v$ represents the capacitance of a tuning varactor, connected between the gate circuit and the common drain, $L_{eq}$ the series inductance of the input circuit 702. C is the capacitance of the interdigitated coplanar cavity resonator capacitor described below and Cg the capacitance of the equivalent input 704 of the FETs connected to the source-drain circuit of FIG. 10.

Figure 10:
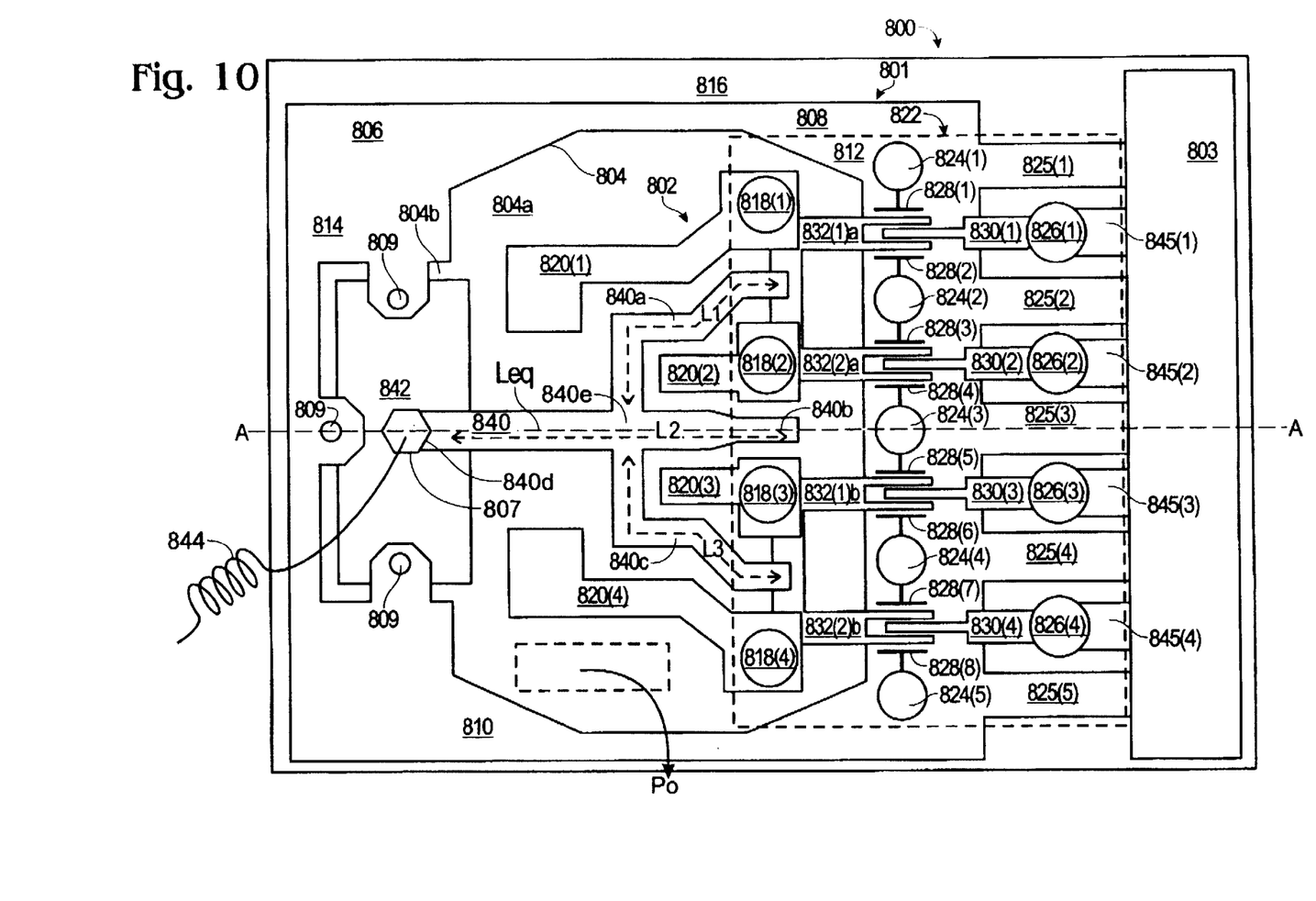
FIG. 10 is a plan view of an interdigitated capacitor coplanar cavity resonator of an embodiment of a common-drain oscillator in accordance with this invention.

If the capacitance of $C_1$ is too small, there will be too little tuning range afforded by varactor $C_v$ or, if $C_v$ is made smaller to increase the tuning range, it is possible that the increased series resistance of the varactor will cause $r_e$ to be larger in magnitude than $r_j$ (the equivalent negative input resistance of the FETs as connected to the source-drain circuit of FIG. 10), thereby preventing oscillation.

If the capacitance of $C_1$ is too large, such that resonator 702 is coupled too strongly to the input 704 to the FETs, the noise-induced reactance fluctuations in $C_g$ will cause large fluctuations in oscillation frequency resulting in excessive phase noise.

The $L_{eq}$ of the input circuit 702 must be reasonably low to allow high frequency operation. If the return path for currents circulating in the input circuit is too long, series inductance will be too large to achieve high tuning frequencies when $C_1$ is in its desired range.

A coplanar interdigitated capacitor "coplanar cavity" resonator oscillator circuit 800 is shown in FIG. 10. The term coplanar cavity is used here as an analog to the conventional cavity known in oscillator use. It is a two-dimensional analog of the regular three dimensional cavity. The shape of the resonator somewhat resembles a cross-section taken along an axis of a re-entrant cylindrical cavity resonator, having an internal center post (located on the axis) protruding from one inner wall, spaced away from the inside of an opposite inner wall.

A varactor 807 connects the equivalent of the re-entrant post to the equivalent of one inner wall of the coplanar cavity. A coplanar interdigitated capacitor 802 and FET inputs in series correspond to the capacitive gap between the equivalent post and the equivalent opposite inner wall. The circuit 800 provides low series resistance and inductance at the FET input 702 (cf., $r_e$, $L_{eq}$ of FIG. 9), while allowing sufficient series capacitance $C_1$ for successful common-drain oscillator operation.

A coplanar interdigitated capacitor coplanar cavity resonator circuit 801 is connected to one side of a FET array 822. A second coplanar circuit 803 is connected to the opposite side of the FET array 822. A common-drain connection (described further below) to both the circuit 801 and 803 is disposed between the circuit 801 and circuit 803. The circuits 801 and 803 are formed as described before by patterning a conductive sheet on an insulating substrate 816 in the conventional manner.

The gate circuit 801 includes the coplanar interdigitated capacitor 802 within a coplanar conductive frame 806, the frame having an internal perimeter 804. The source circuit 803 may be one of a number of coplanar circuits, such as open circuit, nearly quarter-wave length transmission lines and the like, suitable for providing sufficient capacitive feedback between the source and drain of related FETs.

The frame 806 is comprised of two opposed outer legs 808 and 810 contiguous at one pair of opposed ends with a drain terminal common conductor segment 812 and contiguous at the opposite pair of opposed ends with a varactor conductor segment 814.

The coplanar capacitor 802 is surrounded by the internal perimeter 804 of the coplanar conductive frame 806. The perimeter 804 defines a coplanar cavity section 804a and a varactor inset section 804b. A portion of perimeter 804 of coplanar cavity section 804a is shaped as a slightly elongated hexagonal polygon enclosing the capacitor 802. The aspect ratio of height to width for the coplanar cavity 804a shown in FIG. 10 is about 1.3:1. The dimensions and aspect ratio of the coplanar cavity section 804a may vary over a considerable range. The dimensions and aspect ratio of the coplanar cavity section 804a are selected to provided resonance at a suitable frequency.

The varactor inset section 804b may be a generally square or rectangular shape defined in the segment 814 for receiving a tuning varactor 807, having a cathode 807a and an anode 807b (not shown).

In other embodiments of the present invention, the resonator may be shaped other than hexagonal (e.g., circular, polygonal and the like), and the varactor need not be inset. The aspect ratio of the resonator coplanar cavity 804a can vary considerably. Where spatial constraints are not a problem, an aspect ratio of approximately 1:1 is desirable to minimize losses.

The dimensions of the perimeter of the coplanar cavity section 804a and the spacing of the perimeter from the capacitor 802 are selected by using a commercial electromagnetic simulation software package, such as Zeland Software's "IE3D", subject to the constraints of the desired tuning frequency (i.e., smaller for higher frequency) and sufficiently low loss (i.e., lower for larger size).

The coplanar capacitor 802 is comprised of a set of spaced apart coplanar gate conductor segments 820(1:4) interdigitated with a subset of spaced apart conductor furcations 840a,b,c. (1:4 indicates the sequence of index numbers 1, 2, 3, 4). The furcations 840a,b,c are joined at a common central conductor input junction 840e at a proximal end of a base conductor segment 840. Conductor 840 has a contact 840d at a distal end. The furcation 840b is disposed between furcations 840a and 840c. The contact 840d extends distally into the varactor inset 804b and connects to the varactor anode 807b (not shown). The conductor 840 and the conductor furcations 840a,b,c are disposed symmetrically along a line A—A passing through the furcation 840b and the contact 840d such that the furcation 840a extends distally for a length, L1, between proximal ends of the oppositely adjacent gate conductors 820(1) and 820(2), the furcation 840b extends distally for a length, L., between proximal ends of the oppositely adjacent generally parallel and uniformly spaced gate conductors 820(2) and 820(3), and the furcation 840c extends distally for a length, L3, between proximal ends of oppositely adjacent and generally parallel and uniformly spaced gate conductors 820(3) and 820(4).

The portion of the conductor 840 between the junction 840e and the contact 840d forms an inductive reactance coupling element contributing to part of the inductance, $L_{eq}$ of FIG. 10, over the frequency range of interest.

The extension dimensions L1, L2, L3 and spacings between the adjacent furcations 840 and the conductors 820 are arranged such that signal currents in the central conductor 840 are divided equally by capacitive and electromagnetic coupling to the individual gate electrodes 832(1.2)a and 832(1,2)b. Selection of the spacings and dimensions for the frequency range of interest may be made with the use of commercially available electromagnetic simulation tools.

Spaced apart coplanar gate conductor terminals 818(1:4) are defined on a respective proximal end of the coplanar gate conductor segments 820(1:4). The notation 1:4 indicates a sequence of index numbers, 1, 2, 3, 4. The terminals 818(1:4) are bonded to respective FET gate terminals 818' (1:4) (not shown) of FET array 822.

Spaced apart coplanar common-drain conductor terminals 824(1:5) are defined on the coplanar common-drain terminal common conductor segment 812. The terminals 824(1:5) are bonded to coincident FET common-drain terminals 824' (1:5) (not shown) on the FET array 822. The FET common-drain terminals 824'(1:5) connect to drain electrodes 828 (1:8) in the sequence 1 to 1; 2 to 2.3; 3 to 4,5; 4 to 6,7 and 5 to 8; where the first index is the drain terminal index number and the second index is a drain electrode index number.

The FET array 822 includes two C-shaped FET gate metalization segments 832a,b having extended arms 832(1, 2)a and 832(1,2)b connecting to the gate fingers that control the current in drain electrodes 828(1,2), 828(3,4), 828(5,6) and 828(7,8) respectively.

Signals from the drain electrodes 828 are combined by the common connection through the common drain segment 812.

Spaced apart coplanar source conductor terminals 826 (1:4) are defined on source conductor segments 830(1:4) for bonding to FET source terminals 826(1:4) on the FET array 822.

A varactor electrode (cathode or anode) connector layer 842 is disposed in the inset 804b and connects to overlapping conductor tabs 809 from the perimeter of the inset section 804b of the frame 806.

Tuning voltages are applied to the varactor anode 807a (not shown) by a RF choke 844 connected to a variable power supply (not shown).

Coplanar source circuit 803 is connected to the source terminals 826 to provide suitable source-drain feedback to the FETs as required. The circuit 803 may be typically a combined circuit connected to the FETs by multiple source conductor segments 845(1:4) between adjacent drain segments 825(1:5).

The interdigitated capacitor 802 of this invention adds the optimum amount of input series capacitance with minimal parasitic series inductance to minimize the deleterious effect of capacitance fluctuations in the FET on the operating frequency of the oscillator circuit. This minimizes the phase noise of the output signal from the oscillator.

Referring again to FIG. 9, the capacitance $C_v$ corresponds to the capacitance of the varactor 807, $r_e$ to the series resistance in the resonator (including the series resistance of the capacitor 802, the inductor 840e and the varactor 807), $-r_i$ to the equivalent negative resistance of the FET input at resonance, and $L_{eq}$ to the inductive component of the central conductor leg 840 between the furcations 840a,b,c and the contact 840d along with the self inductance of the capacitor 802, the varactor 807 and the frame return legs 808, 810.

The compact nature of the interdigitated capacitor 802 and the consequent short segments 820(1:4), and 840a:c, provide minimum parasitic self inductance and therefore higher attainable tuning frequencies for oscillator performance.

It can be shown that by joining the inductive leg 840 into parallel furcations 840a,b, and c capacitively coupled to parallel multiple conductors 820(1:4), in many cases the series inductance of the parallel furcations and conductors is less than it otherwise would be if summed length of the parallel furcations and conductors were a single parallel conductor pair capacitively coupled together.

It is a further advantage of the interdigitated capacitor 802 to have multiple conductor terminal pads 818 which allow interconnection with corresponding multiple FET terminals for obtaining increased power output and lower phase noise.

Figure 11:
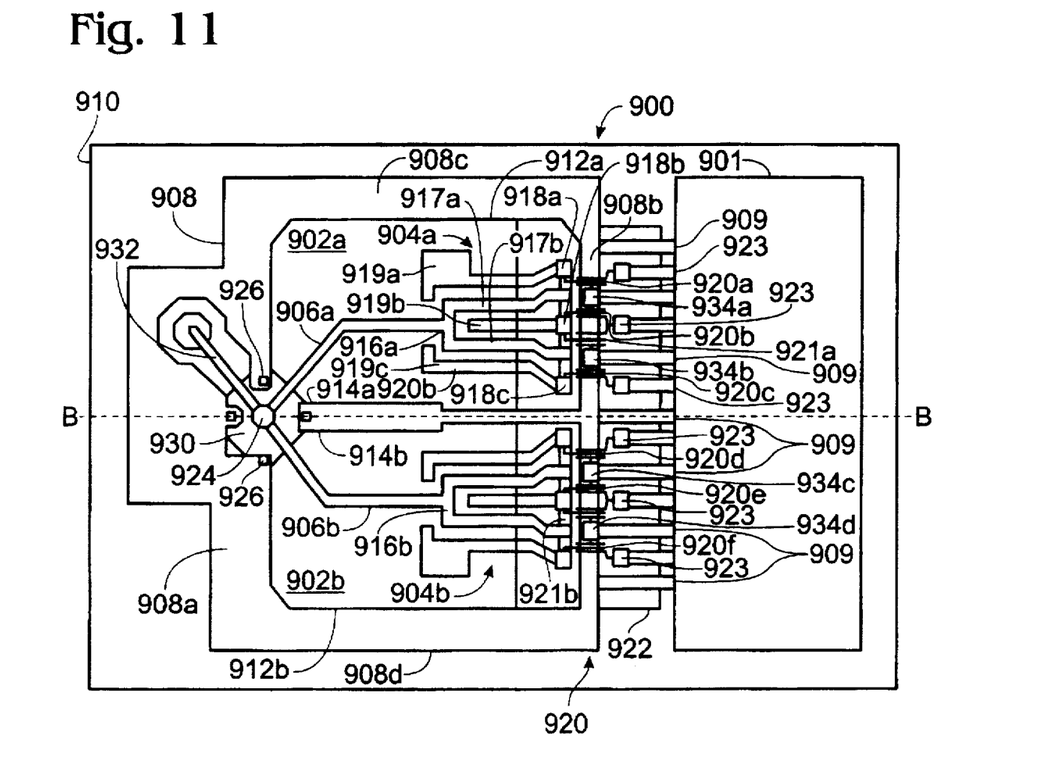
FIG. 11 depicts a double resonator embodiment of a common-drain interdigitated capacitor coplanar cavity resonator oscillator in accordance with this invention.

With reference to FIG. 11, there is shown a double resonator embodiment 900 of a common-drain interdigitated capacitor coplanar cavity resonator oscillator in accordance with this invention.

First and second coplanar cavities 902a and 902b are defined in a coplanar conductive frame 908. The frame 908 is deposited and patterned by a conventional process as described before, on a substrate 910. The frame 908 may be circular or generally rectangular and defines two opposed ends 908a,b connected to orthogonal opposed sides 908c,d.

First and second interdigitated capacitors 904a and 904b are disposed symmetrically about a center line B, in the symmetrically disposed cavities 902a,b respectively.

The cavities 902a,b are defined by internal perimeters 912a,b of the frame 908 surrounding the capacitors 904a,b respectively. The perimeters 912a,b are spaced sufficiently far from the capacitors 904a,b to minimize deleterious capacitive coupling effects but are sufficiently limited in spacing to achieve high tuning frequency. A coplanar cavity center conductor 914 has opposed edges 914a,b disposed symmetrically about the center line B, the edges forming part of the perimeter 912a,b of the tuning cavities 902a,b.

The interdigitated capacitors 904a and 904b include alternate capacitor conductor segments 917a,b spaced apart from alternate gate conductor segments 919a,b,c.

Central capacitor conductor 906a of first capacitor 904a forks at junction 916a into the branching capacitor conductor segments 917a,b. The segments 917a,b extend proximally toward FET array 922, and distally toward a varactor anode connection 924, generally extending parallel to and spaced uniformly between the alternate adjacent gate capacitor conductor segments 919a,b,c respectively.

The gate capacitor conductor segments 919a,b,c extend proximally toward the FET array 922 to connect at one end in gate conductor terminals 918a,b,c respectively. The segments 919 extend distally between alternate segments 917 and terminate in open-circuit ends. The terminals 918a,b,c are connected to respective gate terminals 918'a,b,c (not shown) of FETs 920a,b,c in one half of flip chip FET array 922.

Bias may be provided to the gates of the FETs by a connection from a bias supply (not shown) to a pad located on one of the segments 919, for example at the distal end of segment 919a. A gate bias cross connection 921a on the chip, connects the three-terminals 918a,b,c together. Separate connection could be made to each segment independently, at the cost of additional pads and bonding wires. The cross connection 921a also may help to suppress odd mode oscillations between the connected FETs.

The alternating sequence of capacitively coupled segments 917 and gate segments 919 are connected at opposing proximal and distal ends to form an interdigitated capacitor structure.

The extension dimension and spacings between adjacent branching segments 917 and gate conductor segments 919 are selected such that signal current in the central conductors 906a,b is capacitively and electromagnetically divided into gate currents of essentially equal magnitude and phase into each respective FET.

The second capacitor 904b is a mirror image of capacitor 904a and divides signal current from conductor 906b equally in magnitude and phase into FETs 920d,e,f of the array 922.

FET source connections 923 are made to a source-drain interdigitated capacitor feedback circuit structure (not shown) as described before, to add the optimum amount of source-drain feedback capacitance to optimize oscillations over the tuning range.

FET drain terminals 934a,b,c,d of the FETs 920a,b,c,d,e and f are connected to the opposite side 908b of the frame 908 forming a common-drain RF ground at the drain of the FETs. The placement of the common-drain 908b between the gate terminals 918 and source terminals 923 acts to direct the signal currents common to the gate-drain and gate-source circuits in a controlled manner providing minimum parasitic inductance and capacitance to the common point.

Capacitor conductors 906a,b extend distally and join to make contact with the flip mounted tuning varactor anode 924. The conductors 906a,b act inductively to couple the capacitors 904a,b through the varactor 924 and returning through the frame 908 and 914 to the common drain conductor 908b.

In order to achieve high resonant Q with wide tunability and subject to the negative resistance limitation of the FET array 922, the inductance of the resonator 900 must have minimal distributed capacitance and minimal conductor resistance. If the coplanar cavity central return conductor 914 is too narrow, the resistance, contributing to $r_e$, becomes too high. If the conductor 914 is too wide, the distributed capacitance becomes too high. The width of the conductor 914 must be optimized for best performance.

Conductive tabs 926 extending from the one side 908a in the frame 908 are connected to a conductive electrode layer 930 of the varactor 935. An RF choke 932 connected to the other varactor electrode layer 924 provides bias voltage for tuning the varactor from an external power supply (not shown).

With reference to FIG. 11, the double resonator 900 functions in a fashion similar to the single resonator of FIG. 10 except that gate current to the FETs are divided into two parallel in-phase paths over a portion of the resonator 900 between the varactor 924 and the FET array 922, i.e., split by the conductors 906a,b into the two capacitors 904a,b and returned by the coplanar cavity frame 908 and coplanar cavity center conductor 914.

Measurements show that a coplanar common-drain interdigitated capacitor dual coplanar cavity oscillator of the present invention using a pseudomorphic high electron mobility transistor (PHEMT) can achieve a tuning range greater than 2 GHz at a center frequency of about 40 GHz with a phase noise of better than about 76 dBc (decibels below carrier) per Hertz at a frequency 100 kHz offset from the center frequency of oscillation. The PHEMT has a gate length about 0.15 microns, and a total gate width about 900 microns. The PHEMT is divided into 6 cells with 2 gate fingers per cell, each cell having its own gate pad and its own source pad, the source/drain having a series of 7 pads, with one source pad between each pair of cells, and one source pad on each end of the array. The source, drain and gate pads are configured large enough for flip chip bounding, about 2 mils in diameter.

This PHEMT was combined with a resonator tuned by electrostatic barrier varactors to form the oscillator as described in recently filed U.S. patent application Ser. No. 08/555,777 incorporated herein by reference.

It should be noted that in alternative embodiments of the invention the coplanar interdigitated capacitors 904a,b and the coplanar cavity 908 may be placed on the surface of the FET array 922 if suitable conductor coating and patterning capability exists. Placing the capacitors 904 and coplanar cavity 908 on the surface of a GaAs FET integrated circuit would result in smaller oscillator circuits at the same frequency and/or higher operating frequency. The improved performance is due to the higher dielectric constant of the GaAs, and the resulting lower parasitic of the capacitor when it is patterned on the chip along with elimination of some bond connections (e.g. ball or bump) between the FET and the capacitor/planar cavity.

The capacitors 904a,b may also be realized by a metal insulator-metal (MIM) structure instead of an interdigitated circuit. The source-drain capacitor can also be placed on the surface of the FET chip and/or fabricated as an MIM capacitor. Other flip mounted components such as inductors, capacitors, multiple diodes and the like may be mounted on the substrate to realize alternative oscillators in accordance with this invention.

Other active devices may be used in alternative embodiments of the invention, e.g. bipolar transistors, heterojunction transistors, field effect transistors, bipolar transistors, resonant tunneling transistors, real-space transfer devices, permeable base transistors, solid state triodes, vacuum triodes, controlled avalanche triode devices, and superconducting triode devices. It is also contemplated that two-terminal devices such as Gunn diodes, tunnel diodes and the like could be used in embodiments of this invention without a feedback circuit.

In accordance with this invention, it is to be understood that the above description is illustrative only and not limiting of the disclosed invention. It will be appreciated that it would be possible to modify the size, shape and appearance and methods of manufacture of various elements of the invention or to include or exclude various elements within the scope and spirit of this invention. Thus the invention is to be limited only by the claims as set forth below.

What is claimed is:

1. Millimeter-wave and microwave circuit structures comprising:

an insulating substrate surface, the surface defining a connection region;

first, second, and third coplanar conductors mounted on the surface, each conductor having a proximal portion extending into the connection region, the first and second conductors having respective distal portions extending in different directions from the connection region, and the third conductor having a first distal portion extending adjacent to the distal portion of the first conductor and a second distal portion extending adjacent to the distal portion of the second conductor, the first and second distal portions of the third conductor being isolated from ground; and at least one active device having an input signal control terminal, an inverting output signal-carrying terminal and a non-inverting output signal-carrying terminal, the signals in the output signal-carrying terminals dependent on the input signal in the input signal control terminal, the active device being positioned in the connection region with the input signal control terminal coupled to the first conductor, the non-inverting output signal carrying terminal coupled to the second conductor and the inverting output signal carrying terminal coupled to the third conductor.

2. Millimeter-wave and microwave circuit structures as set forth in claim 1, in which the first conductor and the second conductor are both disposed on one side of the third conductor.

3. Millimeter-wave and microwave circuit structures comprising:

an insulating substrate surface, the surface defining a connection region;

first, second, and third coplanar conductors mounted on the surface, each conductor having a proximal portion extending into the connection region, the first and second conductors having respective distal portions extending in different directions from the connection region, and the third conductor having a first distal portion extending adjacent to the distal portion of the first conductor and a second distal portion extending adjacent to the distal portion of the second conductor, the first conductor and the second conductor being disposed on opposite sides of the third conductor; and at least one active device having an input signal control terminal, an inverting output signal-carrying terminal and a non-inverting output signal-carrying terminal, the signals in the output signal-carrying terminals dependent on the input signal in the input signal control terminal, the active device being positioned in the connection region with the input signal control terminal coupled to the first conductor, the non-inverting output signal-carrying terminal coupled to the second conductor and the inverting output signal-carrying terminal coupled to the third conductor, whereby the third conductor passes between the control terminal and the non-inverting terminal.

4. Millimeter-wave and microwave circuit structures comprising:

an insulating substrate surface, the surface defining a connection region;

first, second, and third coplanar conductors mounted on the surface, each conductor having a proximal portion extending into the connection region, the first and second conductors having respective distal portions extending in different directions from the connection region, and the third conductor having a first distal portion extending adjacent to the distal portion of the first conductor and a second distal portion extending adjacent to the distal portion of the second conductor;

a fourth coplanar conductor mounted on the surface, the conductor having a proximal portion extending into the connection region, the fourth conductor having respective first and second distal portions extending in different directions from the connection region, and the fourth conductor having the first distal portion extending adjacent to the distal portion of the first conductor and the second distal portion extending adjacent to the distal portion of the second conductor; and at least first and second active devices, the first active device having a first input signal control terminal, a first inverting output signal-carrying terminal and a first non-inverting output signal-carrying terminal, the signals in the first output signal-carrying terminals dependent on the input signal in the first input signal control terminal, the second active device having a second input signal control terminal, a second inverting output signal-carrying terminal, and a second non-inverting output signal-carrying terminal, the signals in the second output signal-carrying terminals dependent on the signal in the second input signal control terminal, the first and second active devices being positioned in the connection region with the first and second input signal control terminals coupled to the first conductor, the first and second non-inverting output signal-carrying terminals coupled to the second conductor, the first inverting output signal carrying terminal coupled to the third conductor, and the second inverting output signal-carrying terminal coupled to the fourth conductor.

5. Millimeter-wave and microwave circuit structures as set forth in claim 4, wherein the third and fourth coplanar conductors are connected by another coplanar conductor passing between the first and second conductors.

6. Millimeter-wave and microwave circuit structures as set forth in claim 4, in which the fourth conductor and the third conductor are connected.

7. Millimeter-wave and microwave circuit structures as set forth in claim 6, in which the fourth conductor is contiguous with the third conductor.

8. Millimeter-wave and microwave circuit structures as set forth in claim 1, wherein the distal portion of the first conductor and one distal end of the third conductor are connected to a tuning circuit.

9. Millimeter-wave and microwave circuit structures as set forth in claim 8, in which a portion of the first conductor and one distal end of the third conductor are configured as a part of the tuning circuit.

10. Millimeter-wave and microwave circuit structures as set forth in claim 1, wherein the distal end of the second conductor and one distal end of the third conductor are connected to a feedback circuit.

11. Millimeter-wave and microwave circuit structures as set forth in claim 10, wherein a portion of the second conductor and one distal end of the third conductor are configured as a part of the feedback circuit.

12. Millimeter-wave and microwave circuit structures as set forth in claim 1, in which:

the distal end of the first conductor and one distal end of the third conductor are connected to a tuning circuit;

the distal end of the second conductor and the other distal end of the third conductor are connected to a feedback circuit.

13. Millimeter-wave and microwave circuit structures as set forth in claim 12, wherein the tuning circuit and feedback circuit are arranged such that the structure is an oscillator.

14. Millimeter-wave and microwave circuit structures as set forth in claim 10 in which the feedback circuit includes a coplanar capacitor.

15. Millimeter-wave and microwave circuit structures as set forth in claim 11 in which the feedback circuit includes a coplanar capacitor.

16. Millimeter-wave and microwave circuit structures as set forth in claim in 12 which the feedback circuit includes a coplanar capacitor.

17. Millimeter-wave and microwave circuit structures as set forth in claim 13 in which the feedback circuit includes a coplanar capacitor.

18. Millimeter-wave and microwave circuit structures as set forth in claim 4, wherein:

the conductors connected to the first device comprise part of a first oscillator circuit;

the conductors connected to the second device comprise part of a second oscillator circuit.

19. Millimeter-wave and microwave circuit structures as set forth in claim 18, wherein:

the signals of the first and second oscillators are locked such that the oscillators oscillate in phase.

20. Millimeter-wave and microwave circuit structures as set forth in claim 18, wherein: the first and second oscillator circuits are coupled such that the oscillators oscillate in push pull.

21. A coplanar circuit as set forth in claim 1, in which:

the active device is selected from the group consisting of field effect transistors, bipolar transistors, heterojunction transistors, resonant tunneling transistors, real-space transfer devices, permeable base transistors, solid state triodes, vacuum triodes, controlled avalanche triode devices, and superconducting triode devices.

22. A coplanar circuit as set forth in claim 1, in which the circuit is a common-drain oscillator.

23. An oscillator as set forth in claim 8, in which the tuning circuit is selected from the group consisting of coplanar slotline circuits, coplanar waveguide circuits and coplanar transmission line circuits.

24. An oscillator as set forth in claim 10, in which the feedback circuit is selected from the group consisting of coplanar slotline circuits, coplanar waveguide circuits, coplanar transmission line circuits and coplanar feedback circuits.

25. A high frequency oscillator circuit, comprising:

an insulating substrate having a surface;

a connection region defined on the surface;

a first plurality and second plurality of spaced apart, capacitively coupled coplanar conductor segments, each segment having a proximal and a distal end, the segments of one plurality interdigitated with the segments of the other plurality such that each segment of one plurality is disposed between two adjacent segments of the other plurality, the proximal ends of the first plurality extending into the connection region, the distal ends of the other plurality extending out of the connection region and being joined at a common input junction;

a coplanar conductor frame having an internal perimeter surrounding the first and second plurality of conductor segments, the frame having a terminal conductor segment extending into the connection region, the frame further comprising a second conductor segment forming a portion of the frame extending outside the connection region;

a coplanar base conductor segment having a proximal end connected to the common junction, and a distal end extending away from the common junction, toward the portion of the frame;

a coupling element connected between the distal end of the base conductor segment and the portion of the frame.

26. A high frequency oscillator circuit as set forth in claim 25, further comprising:

a coplanar feedback circuit disposed on the substrate, outside the conductor frame, the feedback circuit having a plurality of feedback conductors extending into the connection region.

27. A high frequency oscillator circuit as set forth in claim 26, further comprising:

an integrated circuit including a pair of spaced apart three-terminal active devices, each device having an input signal control electrode, a non-inverting output signal-carrying electrode, and an inverting output signal-carrying electrode in which signals in the respective output signal-carrying electrodes are responsive to signals in the corresponding input control electrode, the integrated circuit flip-chip bonded to the substrate such that the control electrode of the first device is bonded to a first one of the proximal ends of the first plurality of coplanar conductor segments in the connection region, the control electrode of the second device is bonded to a second one of the proximal ends of the first plurality of coplanar conductor segments in the connection region, the inverting output signal electrode of the first device is bonded to the terminal conductor segment in the connection region, the inverting output signal electrode of the second device is bonded to the terminal conductor segment in the connection region, the non-inverting output signal electrode of the first device is bonded to a first one of the plurality of feedback conductors in the connection region, and the non-inverting output signal electrode of the second device is bonded to a second one of the plurality of feedback conductors in the connection region, whereby output signals from the inverting output signal electrodes will be combined in the terminal conductor segment.

28. A high frequency oscillator circuit as set forth in claim 27, in which the coupling element is a tuning device.

29. A high frequency oscillator circuit as set forth in claim 28, wherein the tuning device is an electrically tunable component.

30. A high frequency oscillator circuit as set forth in claim 29 wherein the electrically tunable component is a varactor.

31. A high frequency oscillator circuit as set forth in claim 27, wherein:

the coupling element includes an elongate coplanar strip configured to have inductive reactance at a selected frequency range.

32. A coplanar circuit as set forth in claim 27, in which: the active devices are selected from the group consisting of field effect transistors, bipolar transistors, heterojunction transistors, resonant tunneling transistors, real-space transfer devices, permeable base transistors, solid state triodes, vacuum triodes, controlled avalanche triode devices, and superconducting triode devices.

33. A coplanar circuit as set forth in claim 27, in which: the circuit is a common-drain oscillator.

34. A coplanar circuit as set forth in claim 27, in which the inverting electrodes are connected at a shared flip-chip bond.

35. A coplanar circuit as set forth in claim 27, further comprising a second pair of spaced apart three-terminal active devices, the second pair of devices each having an input signal control electrode, a non-inverting output signal-carrying electrode, and an inverting output signal-carrying electrode in which output signals in the respective output signal-carrying electrodes are responsive to signals in the corresponding input signal control electrode, electrodes bonded to the substrate such that the control electrode of the first device of the second pair is bonded to a third one of the proximal ends of the first plurality of coplanar conductor segments in the connection region, the control electrode of the second device of the second pair is bonded to a fourth one of the proximal ends of the first plurality of coplanar conductor segments in the connection region, the inverting output signal electrode of the first device of the second pair is bonded to the terminal conductor segment in the connection region, the inverting output signal electrode of the second device of the second pair is bonded to the terminal conductor segment in the connection region, the non-inverting output signal electrode of the first device of the second pair is bonded to a third one of the plurality of feedback conductors in the connection region, and the non-inverting electrode of the second device of the second pair is bonded to a fourth one of the plurality of feedback conductors in the connection region.

36. A coplanar circuit as set forth in claim 35, wherein the inverting electrodes of the second pair of devices are bonded to the terminal conductor segment between the inverting electrode bonds of the first pair.

37. A coplanar circuit as set forth in claim 35, wherein the inverting electrodes of the second pair of devices are bonded to the terminal conductor segment at opposed ends at either side of the inverting electrode bonds of the first pair.

38. A coplanar circuit as set forth in claim 27, in which the placement, size and shape of the conductors, terminals and electrodes are such that, signals in each respective control, inverting and non-inverting electrode and corresponding conductor are urged to be of sufficiently equal amplitude and relative phase, whereby arithmetic summation of signals is sufficiently near a maximum.

* * * * *